US009728664B2

United States Patent
Doech et al.

(10) Patent No.: US 9,728,664 B2
(45) Date of Patent: Aug. 8, 2017

(54) SOLAR MODULE WITH CONNECTION SOCKET, AND METHOD FOR PRODUCING THE SAME

(71) Applicant: SAINT-GOBAIN GLASS FRANCE, Courbevoie (FR)

(72) Inventors: Matthias Doech, Munich (DE); Hans-Werner Kuster, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 104 days.

(21) Appl. No.: 14/239,920

(22) PCT Filed: Sep. 28, 2012

(86) PCT No.: PCT/EP2012/069294
§ 371 (c)(1),
(2) Date: Feb. 20, 2014

(87) PCT Pub. No.: WO2013/045682
PCT Pub. Date: Apr. 4, 2013

(65) Prior Publication Data
US 2014/0216526 A1    Aug. 7, 2014

(30) Foreign Application Priority Data
Sep. 30, 2011   (EP) ............................... 11183515

(51) Int. Cl.
*H01L 31/048* (2014.01)
*H01L 31/05* (2014.01)
*H02S 40/34* (2014.01)

(52) U.S. Cl.
CPC .......... *H01L 31/0485* (2013.01); *H01L 31/05* (2013.01); *H02S 40/34* (2014.12)

(58) Field of Classification Search
CPC ........... H01L 31/02013; H01L 31/0485; H01L 31/05; H01R 13/5205; H02S 40/34
See application file for complete search history.

(56) References Cited

U.S. PATENT DOCUMENTS 5,503,684 A    4/1996  Duran
6,235,984 B1 *  5/2001  Wambach ............. H01L 31/048
                                                 136/256
(Continued)

FOREIGN PATENT DOCUMENTS

CA    2475184    *  1/2005  ......... H01R 13/5205
CN    1577980 A      2/2005
(Continued)

OTHER PUBLICATIONS

JP2006-202542 A, Machine Translation, Hashimoto, Aug. 2006.*
(Continued)

*Primary Examiner* — Devina Pillay
(74) *Attorney, Agent, or Firm* — Steinfl + Bruno LLP

(57) ABSTRACT

A solar module, particularly a thin-layer solar module, is described. The solar module has a laminated complex with two substrates between which there is a layer structure which has a front electrode layer, a back electrode layer and an intermediate semiconductor layer for forming a plurality of solar cells connected up in series, two contact elements at least one top element two contact pieces, and at least one connection socket. A method for producing the solar module is also described.

19 Claims, 4 Drawing Sheets

(56) References Cited

U.S. PATENT DOCUMENTS

| | | |
|---|---|---|
| 7,444,743 B2 | 11/2008 | Feldmeier et al. |
| 7,655,859 B2 | 2/2010 | Nass et al. |
| 2005/0022859 A1* | 2/2005 | Nass .................. H01R 13/5205 136/251 |
| 2005/0054244 A1 | 3/2005 | Werner et al. |
| 2006/0180196 A1 | 8/2006 | Lares et al. |
| 2010/0229918 A1* | 9/2010 | Okamoto ................ B32B 15/08 136/244 |
| 2010/0243047 A1 | 9/2010 | Kuster et al. |

FOREIGN PATENT DOCUMENTS

| | | | |
|---|---|---|---|
| DE | 4324318 | 12/1995 | |
| DE | 10334935 | 12/2004 | |
| DE | 102005025632 | 12/2006 | |
| EP | 2200097 | 6/2010 | |
| JP | 2005045256 A | 2/2005 | |
| JP | 2006-202542 A * | 8/2006 | ............. H01R 13/11 |
| JP | 2009224597 A | 10/2009 | |
| KR | 20070110330 A | 11/2007 | |
| KR | 20100087008 A | 8/2010 | |
| WO | 2009/129405 | 10/2009 | |

OTHER PUBLICATIONS

PCT International Search Report mailed on Jan. 10, 2013 for PCT Application PCT/EP2012/069294 filed on Aug. 1, 2012 in the name of SAINT GOBAIN GLASS FRANCE.
PCT Written Opinion mailed on Jan. 10, 2013 for PCT Application PCT/EP2012/069294 filed on Sep. 28, 2012 in the name of SAINT GOBAIN GLASS FRANCE.

* cited by examiner

SOLAR MODULE WITH CONNECTION SOCKET, AND METHOD FOR PRODUCING THE SAME

CROSS REFERENCE TO RELATED APPLICATIONS

The present application is the US national stage of International Patent Application PCT/EP2012/069294 filed on Sep. 28, 2012 which, in turn, claims priority to European Patent Application EP 11183515.3 filed on Sep. 30, 2011.

DESCRIPTION

Photovoltaic layer systems for the direct conversion of sunlight into electrical energy are well known. They are commonly referred to as "solar cells", with the term "thin-film solar cells" referring to layer systems with small thicknesses of only a few microns that require carrier substrates for adequate mechanical stability. Known carrier substrates include inorganic glass, plastics (polymers), or metals, in particular metal alloys, and can, depending on the respective layer thickness and the specific material properties, be designed as rigid plates or flexible films.

In view of the technological handling quality and efficiency, thin-film solar cells with a semiconductor layer of amorphous, micromorphous, or polycrystalline silicon, cadmium telluride (CdTe), gallium-arsenide (GaAs), or a chalcopyrite compound, in particular copper-indium/gallium-disulfur/diselenide, abbreviated by the formula $Cu(In,Ga)(S,Se)_2$, have proved advantageous. In particular, copper-indium-diselenide ($CuInSe_2$ or CIS) is distinguished by a particularly high absorption coefficient due to its band gap adapted to the spectrum of sunlight.

Typically, with individual solar cells, it is only possible to obtain voltage levels of less than 1 volt. In order to obtain a technically useful output voltage, many solar cells are connected to one another serially in a solar module. For this, thin-film solar modules offer the particular advantage that the solar cells can already be serially connected in an integrated form during production of the films. Thin-film solar modules have already been described many times in the patent literature. Reference is made merely by way of example to the printed publications DE 4324318 C1 and EP 2200097 A1.

Typically, to produce the thin-film solar cells, the layers are applied directly on a substrate that is adhesively bonded to another substrate to form a weather-resistant composite. The layer structure between the two substrates includes a rear electrode layer and a photovoltaically active absorber layer. The absorber layer has a semiconductor layer and a front electrode layer. For an external electric connection, each thin-film solar module has two voltage terminals. For this, two busbars contacting the rear electrode layer are provided, which are, in each case, for example, electrically conductively connected to a foil conductor or a flat band conductor guided to the rear side of the module. On the rear side of the module, the two foil conductors are connected to one or a plurality of connection sockets, which are provided with a connection cable or a plug connection. Such a connection socket is known, for example, from DE 102005025632 A1. At the connection sockets, the solar module can be connected in series to additional solar modules to form a module string or connected to an electrical load, which is frequently an inverter to convert the DC voltage generated into AC voltage suitable for the public power grid.

In industrial series production, foil conductors are manually connected to the connection sockets, for which, for example, clamp contacts are provided. No simple and economical automation is possible such that the production of solar modules is associated with relatively high production costs.

Furthermore, a continuous increase in the series resistance can be observed with thin-film solar modules, which, after service lives of multiple thousands of operating hours gradually transitions into an at least approx. constant value. This aging results in an undesired degradation of the level of efficiency of the solar module. It is assumed that a substantial cause for this is the diffusion of water molecules into the semiconductor material of the solar cells. To inhibit this aging, it is known to seal the edge gap between the two laminated substrates water-tightly and vapor-tightly by means of a sealing strip serving as a diffusion barrier. Moreover, the connection sockets are mounted on the substrate, for example, using a hot-melt adhesive such that the interior is hermetically sealed.

The international patent application WO 2009/129405 A2 describes a junction box for a solar module, in which the contact points can be electrically connected through a cutout in a base plate with the ends of foil conductors. The ends of the foil conductors can be contacted through a contact hole, with the base plate of the junction box not sealing the contact hole. This is also not possible as, otherwise, the contact points can no longer contact the foil conductors.

In contrast, the object of the present invention consists in advantageously improving conventional solar modules, with, in particular, automated installation and electrical connection of the connection sockets being enabled. In addition, penetration of water or water vapor into the solar cells at the connection sockets should be reliably and certainly avoided.

These and other objects are accomplished according to the proposal of the invention by a solar module or solar module arrangement as well as a method for production thereof with the characteristics of the coordinated claims. Advantageous embodiments of the invention are indicated by the characteristics of the subclaims.

According to the invention, a solar module with a laminated composite made up of two substrates is presented. Between the substrates is situated a layer structure that has a front electrode layer, a rear electrode layer, and a semiconductor layer situated between the two electrode layers to form a plurality of solar cells connected in series. The solar module is, preferably, a thin-film solar module with thin-film solar cells connected in an integrated form. In particular, the semiconductor layer is made of a chalcopyrite compound which can be, for example, a I-III-VI semiconductor from the group copper-indium/gallium disulfur/diselenide $(Cu(InGa)(SSe)_2)$, for example, copper-indium-diselenide ($CuInSe_2$ or CIS) or related compounds. The two substrates can contain, for example, inorganic glass, polymers, or metal alloys and can be, depending on layer thickness and material properties, designed as rigid plates or flexible films.

The solar module has two voltage terminals of opposite polarity, on which electrical contact can be made. For this purpose, the solar module includes two contact elements, which are, in each case, electrically conductively connected to the front and/or rear electrode layer. Preferably, the two contact elements are in each case electrically conductively connected only with the rear electrode layer.

Preferably, each of the two contact elements is electrically conductively connected via a strip- or band-shaped busbar to the front and/or rear electrode layer. Thus, each contact element is electrically conductively connected by a busbar to a front and/or rear electrode layer, with the contact element distinct from the busbar. In particular, the contact element is not implemented as a part or a section, in particular an end section, of the busbar.

The two busbars are, for example, implemented as strip- or band-shaped (metal) foil conductors and are made, for example, from aluminum or tinned copper, with the use, however, of other electrically conductive materials that can be processed into foils, also possible. Examples for this are aluminum, gold, silver, or tin and alloys thereof. The busbars can, for example, have a thickness in the range from 0.03 mm to 0.3 mm and a width in the range from 2 mm to 16 mm.

An electrically conductive connection between the busbars and the respective electrode layer is accomplished, for example, by welding, bonding, soldering, clamping, or gluing using an electrically conductive adhesive. Preferably, the two busbars are in each case mounted on the rear electrode layer and electrically conductively connected to the rear electrode layer.

The two contact elements are arranged in at least one contact hole (perforation) of at least one substrate, with the two contact elements possibly being arranged in one and the same contact hole or in a separate contact hole in each case. For the case in which two contact holes are provided, both contact holes can be implemented in one and the same substrate or in different substrates. The two contact elements are situated at least in sections, in particular completely, inside a cavity that is formed or bounded by the at least one contact hole.

It is essential here that the at least one contact hole be implemented such that it enables an electrical connection between the contact elements and the front and/or rear electrode layer. For the case in which two busbars are provided, access to the two busbars is made via the at least one contact hole. Preferably, the solar module includes two contact holes, which provide access in each case to one of the two busbars. Each contact element is situated, at least in sections, in particular completely, inside a cavity that is formed or bounded by the one contact hole.

The solar module further includes at least one covering element, which seals the at least one contact hole and is mounted, for this purpose, on the substrate forming the contact hole. The covering element completely covers the contact hole. For example, the solar module includes two covering elements, which, in each case, completely cover or seal a separate contact hole and are mounted on the substrate. The covering element is, for example, implemented in the form of a plate. Preferably, the covering element is mounted on the substrate such that the contact hole is gas-tightly and water-tightly sealed by the covering element.

The at least one covering element has two contact pieces, which are, in each case, electrically conductively connected to one of the two contact elements. The at least one covering element can contain an electrically conductive material, with the covering element electrically conductively connected to the two contact elements such that the two contact pieces are, in each case, electrically conductively connected to one of the two contact elements via the covering element.

Preferably, two covering elements are provided, which are, in each case, provided with one (associated) contact piece that is electrically conductively connected to one of the two contact elements. In this embodiment of the solar module, the covering elements can be made, in each case, at least in part, in particular completely, of an electrically conductive material or contain such an electrically conductive material, with the covering elements, in each case, electrically conductively connected to the (associated) contact element such that the contact piece is electrically conductively connected to the contact element by the covering element. For example, the covering element and the contact piece can be made from one electrically conductive material, with the contact piece mounted on the covering element. In particular, the covering element and the contact piece can be implemented in one piece or monolithic. The solar module further includes at least one connection socket, which is mounted encompassing the at least one covering element on the substrate provided with at least one contact hole and has two mating contact pieces, which are, in each case, electrically conductively connected to one of the two contact pieces in the form of a plug connection. For example, the solar module includes two covering elements and two connection sockets, with the two connection sockets mounted encompassing, in each case, a separate covering element and having, in each, case a mating contact piece that is electrically conductively connected to one of the two contact pieces in the form of a plug connection. It is essential here that the two mating contact pieces be implemented such that at the time of the mounting of the at least one connection socket on the substrate provided with the at least one contact hole, they automatically come into electrical contact with the associated contact piece. The at least one covering element is not part of the at least one connection socket, in other words, the connection socket(s) and covering element(s) are distinct from each other.

The at least one connection socket can serve as a base for a connector plug or a connector line. In addition, it can accommodate other functional elements such as diodes or control electronics. The at least one connection socket is, for example, produced from an electrically insulating material, with thermoplastic plastics and elastomers that can be processed by injection molding available for industrial production. Thermoplastic plastics and elastomers used include, for example, polyamide, polyoxymethylene, polybutylene terephthalate, or ethylene propylene diene rubber. Alternatively, hot-melt materials such as acrylate resin systems or epoxy resin systems can also be used for the production of the at least one connection socket. However, it is also conceivable to produce the at least one connection socket from metal or another electrically conductive material with electrically insulating inserts.

The two voltage terminals of the solar module thus include in each case a contact element electrically conductively connected to the front and/or rear electrode layer, optionally, a busbar contacting the front and/or rear electrode layer, a contact piece electrically conductively connected to the contact element, as well as a mating contact piece electrically conductively connected thereto. As a rule, a connector line or connector plug of the connection socket is electrically connected to the mating contact piece.

The solar module according to the invention advantageously enables simple and economical automated assembly of the at least one connection socket on the substrate, as well as their electrical connection to the front and/or rear electrode layer to provide the two voltage terminals of the solar module. The plug connection between the contact piece and as the mating contact piece can, in principle, be implemented in any manner so long as an electrical connection is enabled by plugging into the connection socket. Preferably, for this purpose, the contact pieces are implemented in each case as a contact pin and the mating contact pieces in each case as a spring clamping element to clamp the contact pin.

Mounting of the at least one connection socket on the substrate provided with the at least one contact hole on the rear or front side of the solar module can be accomplished, for example, by gluing, which has the advantage that, by means of the gluing, the interior of the connection socket can be hermetically sealed against gases, water, or moisture. In particular, the electrical contact points in the interior of the connection socket are thus protected against corrosion. For gluing, an adhesive strand or adhesive tape with an acrylic-, polyurethane-, or polyisobutylene-based adhesive can be provided. Such gluing to the substrate can be automated simply. Preferably, the at least one connection socket is glued to the rear side of the module.

In an advantageous embodiment of the solar module according to the invention, the at least one connection socket is mounted via the two electrical plug connections between the contact pieces and the mating contact pieces on the substrate provided with at least one contact hole. The mounting of the at least one connection socket via the electric plug connections can be done in addition to their separate mounting on the substrate, for example, by gluing such that the firm hold of the connection socket on the substrate can be improved. However, alternatively, it is also conceivable that the at least one connection socket be mounted on the substrate exclusively by the two electrical plug connections, thus dispensing with a separate mounting of the connection socket, for example, by gluing. The assembly and the electrical connection of the at least one connection socket can thus be accomplished in a particularly simple manner by merely plugging the mating contact pieces into the contact pieces. For example, two connection sockets are provided, which can, in each case, be mounted on the substrate by only plugging a mating contact piece into a contact piece.

It can be advantageous for the electrical plug connections between contact pieces and mating contact pieces to have, in each case, a latching member such that the mounting of the at least one connection socket can be locking. If the contact pieces are implemented in each case as a contact pin and the mating contact pieces in each case as a spring clamping element to clamp the contact pin, such a latching member can be realized particularly simply, for example, in that one component of the electrical plug connection (contact piece or mating contact piece) is provided with at least one projection which can engage, for the locking mounting of the connection socket, in a corresponding indentation in the other component (mating contact piece or contact piece) of the electrical plug connection.

In the solar module according to the invention, the at least one connection socket can be mounted on the substrate provided with the at least one contact hole by means of adhesive bonding, with the interior of the connection socket being water-tightly or vapor-tightly shielded. Since the at least one connection socket encompasses the at least one covering element, by means of this measure the at least one contact hole can be likewise water-tightly or vapor-tightly shielded. A further improvement of water-tightness or vapor-tightness can be obtained in that a sealing compound sealing solar cells water-tightly and vapor-tightly against the external environment is introduced into the at least one contact hole. The sealing compound can, for example, be an acrylic-, polyurethane-, or polyisobutylene-based adhesive. In addition, the sealing compound can serve to fix the respective contact element in the contact hole, to further improve the automated assembly.

In the solar module according to the invention, the at least one covering element is mounted on the associated substrate. Preferably, mounting is accomplished by a substance-to-substance bond, in particular by an adhesive strand or an adhesive tape with an acrylic-, polyurethane-, or polyisobutylene-based adhesive. Preferably, a bond between the covering element and the substrate is obtained by ultrasonic welding. Thus, in series production an automated assembly of the at least one covering element on the substrate is enabled simply and economically. With regard to automation, it is advantageous for the two contact pieces to be implemented in each case such that they automatically make electrical contact with the contact elements at the time of the mounting of the at least one covering element on the substrate. The mounting of the at least one covering element on the substrate is preferably implemented such that the at least one contact hole is gas-tightly and water-tightly sealed.

It can be advantageous for the contact pieces to be connected in each case to the at least one covering element by a (nondestructively) detachable or removable connection, for example, a screw connection. The contact pieces can thus be selectively adapted in light of the respective application, while the (rest of the) covering element can be produced as an interchangeable part. In addition, the contact piece can be made of a different material from the rest of the covering element.

The invention also extends to a method for the automated production of a solar module as described above, in particular a thin-film solar module, with the following steps:

Preparation of a laminated composite made up of two substrates, between which a layer structure is situated, which has a front electrode layer, a rear electrode layer, and an intermediate semiconductor layer for forming a plurality of solar cells connected in series, Formation of at least one contact hole in at least one substrate;

Arrangement of two contact elements in the at least one contact hole and electrically conductive connection to the front and/or rear electrode layer;

Mounting of at least one covering element on the substrate, which (completely) covers the at least one contact hole, in particular gas-tightly and water-tightly, wherein the at least one covering element has two contact pieces that are in each case electrically conductively connected to one of the two contact elements;

Mounting of at least one connection socket encompassing the at least one covering element on the substrate provided with the at least one contact hole, wherein the at least one connection socket has two mating contact pieces, which are brought in each case into an electrically conductive plug connection with one of the two contact pieces For example, an electrical contact is made with the two contact elements by the at least one covering element such that the two contact pieces are in each case electrically conductively connected to one of the two contact elements. In particular, two covering elements can be provided, which, in each case, have a contact piece, with each contact piece being electrically conductively connected to an (associated) contact element. For example, the contact piece is electrically conductively connected to the (associated) contact element by the covering element.

Preferably, the contact elements are in each case fixed by a sealing compound, introduced into the contact hole and water-tightly and vapor-tightly sealing the solar cells against the external surroundings, by which means the contact elements can be brought particularly simply into position.

Preferably, the at least one connection socket is mounted (for example, exclusively) by plugging in the mating contact pieces on the contact pieces on the substrate provided with the at least one contact hole, by which means a particularly simple assembly of the connection socket is enabled.

BRIEF DESCRIPTION OF THE DRAWINGS

The invention is now explained in detail with the help of exemplary embodiments, with reference to the accompanying figures. They depict.

DETAILED DESCRIPTION OF THE DRAWINGS

Figure 1:
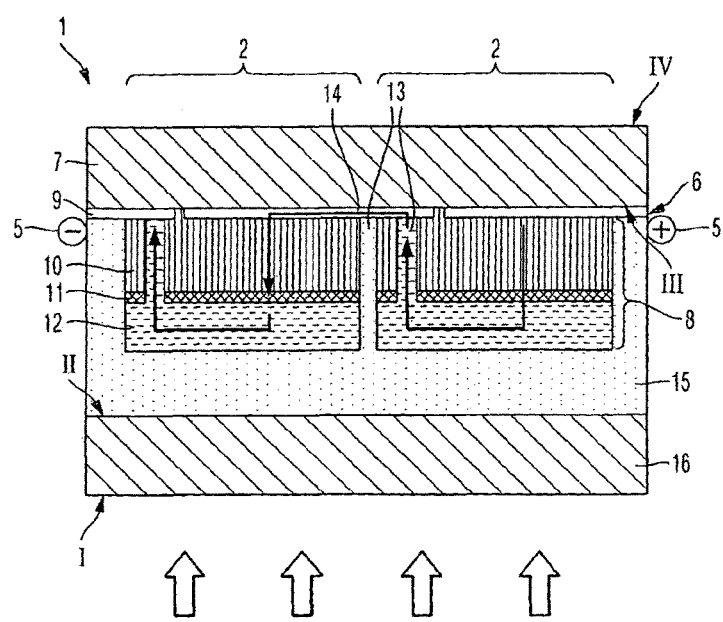
FIG. 1 a schematic cross-sectional representation of a thin-film solar module.

Reference is first made to FIG. 1, which illustrates the structure of a thin-film solar module according to the present invention, referred to as a whole by the reference character 1. According to it, the thin-film solar module 1 comprises a plurality of thin-film solar cells 2 in an integrated form connected to one another in series, of which, by way of example, two are depicted. It is understood that as a rule the thin-film solar module has a large number (e.g., ca. 100) thin-film solar cells 2.

The thin-film solar module 1 is based here, for example, on the so-called "substrate configuration". In this case, it comprises an electrically insulating carrier substrate 7 with a layer structure 6, which is arranged on the light-entry front side (III) of the carrier substrate 7, installed thereupon. The carrier substrate 7 is made here, for example, of glass or plastic, with it equally possible to use other insulating materials with sufficient strength as well as inert behavior relative to the process steps performed. Depending on the respective layer thickness and the specific material properties, the carrier substrate 7 can be designed as a rigid plate or a flexible film. For example, the carrier substrate 7 is implemented in the form of a rigid glass plate with a relatively low light transmittance.

The layer structure 6 is, for example, produced by vapor deposition onto the carrier substrate 7 by means of chemical deposition (CVD) or physical deposition (PVD) from the gas phase or sputtering (magnetic field-assisted cathode sputtering). The layer structure 6 includes a rear electrode layer 9 arranged on the front side (III) of the carrier substrate 7. The rear electrode layer 9 contains, for example, a layer of an opaque metal such as molybdenum, and is, for example, applied by cathode sputtering onto the carrier substrate 7. The rear electrode layer 9 has, for example, a layer thickness of roughly 1 µm. In another embodiment, the rear electrode layer 9 includes a layer stack of different individual layers. Preferably, the layer stack contains a diffusion barrier to prevent diffusion of, for example, sodium out of the carrier substrate 7 into the layers deposited on the rear electrode layer 9, which form a photovoltaically active absorber layer 8.

The absorber layer 8 contains a, for example, p-doped semiconductor layer 10, in particular a p-conductive chalcopyrite semiconductor, such as a compound of the group copper indium diselenide ($CuInSe_2$), in particular sodium (Na)-doped $Cu(InGa)(SSe)_2$. Conversion of the various metals of the semiconductor layer into the semiconductor material occurs through heating in an RTP furnace (RTP=rapid thermal processing). The semiconductor layer 10 has, for example, a layer thickness from 500 nm to 5 µm and, in particular of roughly 2 µm. A buffer layer 11, which, here, contains, for example, an individual layer of cadmium sulfide (CdS) and an individual layer of intrinsic zinc oxide (i-ZnO), is deposited on the semiconductor layer 10. A front electrode layer 12 is applied on the buffer layer 11, for example, by vapor deposition. The front electrode layer 12 is transparent to radiation in the spectral range sensitive for the semiconductor layer 11 ("window layer"), to ensure only slight attenuation of the incident sunlight. The transparent front electrode layer 12 can be referred to generalizingly as a TCO-layer (TCO=transparent conductive oxide) and is based on a doped metal oxide, for example, n-conductive, aluminum-doped zinc oxide (AZO). A pn-heterojunction is formed by the front electrode layer 12, the buffer layer 11, and the semiconductor layer 10, i.e., a sequence of layers of the opposing conductor type. The layer thickness of the front electrode layer 12 is, for example, 300 nm.

The layer system is divided, using methods known per se for producing a (thin-film) solar module 1, into individual photovoltaically active regions, i.e., thin-film solar cells 2. The division is accomplished by incisions 13 using a suitable structuring technology such as laser writing and machining, for example, by drossing or scratching. Adjacent thin-film solar cells 2 are serially connected to each other via an electrode region 14 of the rear electrode layer 9.

Figure 2:
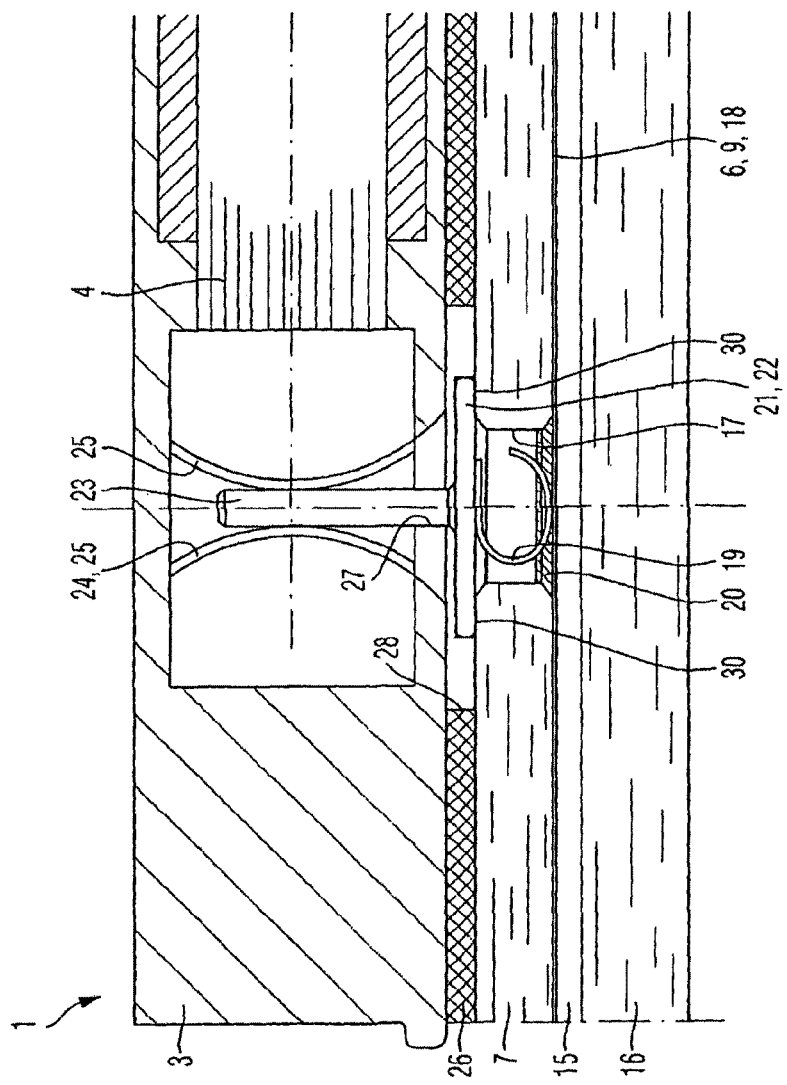
FIG. 2 another schematic cross-sectional representation of the thin-film solar module of FIG. 1 in the region of a connection socket.

In the example depicted here, both the resultant positive (+) and the resultant negative (−) voltage terminal 5 of the solar module 1 are guided over the rear electrode layer 9 on the rear side (VI) of the thin-film solar module 1 and are electrically contacted there, which is explained in detail in FIG. 2.

An intermediate layer 15 that is implemented, for example, as a thermoplastic adhesive layer and contains polyvinyl butyral (PVB) or ethylene vinyl acetate (EVA) is applied on the front electrode layer 12. The thickness of the intermediate layer 15 is, for example, 0.76 mm. For protection against environmental influences, the layer structure composed of carrier substrate 7, rear electrode layer 9, and photovoltaically active absorber layer 8 is sealed over the intermediate layer 15 with a cover substrate 16 implemented as a covering pane that is adhesively bonded to its rear side (II). The intermediate layer 15 is plastically deformable by heating and, with cooling, fixedly bonds the two substrates 7, 16 to each other. The cover substrate 16 is transparent to sunlight and contains, for example, hardened extra white glass with low iron content. The cover substrate 16 has, for example, an area of 1.6 m×0.7 m. The thin-film solar cells 2 can be irradiated by light incident on the front side (I) of the cover substrate 16. In particular, the cover substrate 16 can also be implemented as a plastic film. Generally speaking, the cover substrate 16 serves for the sealing and for the mechanical protection of the layer structure 6.

It is expedient for the edge region between the carrier substrate 7 and the cover substrate 16 to be sealed peripherally with an edge seal as a vapor diffusion barrier, preferably with a plastic material, for example, polyisobutylene, in order to protect the corrosion-sensitive photovoltaically active absorber layer 8 against atmospheric oxygen and moisture.

Reference is now made to FIG. 2, which depicts a schematic cross-sectional view of the thin-film solar module 1 in the region of a connection socket 3. The thin-film solar module 1 has here, for example, two connection sockets 3, one each for a voltage terminal 5. The two connection sockets 3 serve for electrical contacting of the thin-film solar module 1, for example, to connect it with other thin-film solar modules to form a module string or to connect it with an electrical load, for example, an inverter. The connection socket 3 has, for this purpose, a connection cable 4. It would be equally possible to provide the connection socket 3 with a connection plug. In this case the connection socket 3 is manufactured, for example, as an injection molded part made of plastic.

For an electrical connection of the connection socket 3 to the thin-film solar cells 2, a contact hole 17, through which access to a busbar 18 electrically conductively connected to the rear electrode layer 9 is created, is incorporated into the carrier substrate 7. The busbar 18 advantageously enables contacting at an appropriate location, for example, on the edge of the module.

An elastically deformable spring contact element 19 distinct from the busbar 18 and made of an electrically conductive material, for example, spring steel is inserted. The spring contact element 19 is in tangential contact with the busbar 18. The spring contact element 19 is situated at least partially inside the contact hole 17. Fixing of the spring contact element 19 in the contact hole 17 is accomplished by a sealing compound 20, which is arranged distributed over the entire surface in the inner region of the contact hole 17. By means of the sealing compound 20, the busbar 18 or the thin-film solar cells 2 are sealed water-tightly and vapor-tightly against the external surroundings such that the entry of water molecules into the thin-film solar module 1 can be prevented. In principle, any material that is suitable for fixing the spring elements 19 and for serving as a water and vapor barrier can be selected as sealing compound 20. For example, a sealing compound made of polyisobutylene can be used for this purpose.

A covering element 21 is mounted on the rear side (IV) of the carrier substrate 7 in the region of the contact hole 17. The covering element 21 comprises a plate-shaped base 22 and a contact pin 23 formed thereon, which protrudes roughly centrally at a right angle from the base 22 on the side facing away from the contact hole 17. The base 22 covers or seals the contact hole 17 completely, by which means the contact hole 17 is gas-tightly and water-tightly sealed. Mounting of the covering element 21 on the rear side (IV) of the carrier substrate 7 is accomplished by ultrasonic welding of the bottom of the base 22 to the carrier substrate 7, by which means the annular all round weld zone 30 is formed.

The covering element 21 is made in one piece from a metallic material whose relatively low hardness readily enables ultrasound welding, with, for example, aluminum having been selected here. In addition, the covering element 21 can be economically produced using the casting process. The covering element 21 is distinct from the connection socket 3, i.e., it is not a part or component or section of the connection socket 3.

When the covering element 21 has not been installed, the spring contact element 19 protrudes somewhat out of the contact hole 17 such that the spring contact 19 is elastically deformed at the time of the setting of the base 22 of the covering element 21 on the carrier substrate 7. By means of the spring-loaded structure, good electrical contact between the covering element 21 or the contact pin 22 and the spring contact element 19 can be ensured. After assembly of the covering element 21, the spring contact element 19 is situated completely inside the contact hole 17.

The connection socket 3 is provided internally with a spring clamping element 24, which consists of two curved metal springs 25 that are arranged such that they can capture the contact pin 23 between them with clamping force. At the time of the placement of the connection socket 3 on the rear side (IV) of the carrier substrate 7, the contact pin 23 can be inserted in a simple manner between the two metal springs 25 and be clamped there. The connection socket 3 is, for this purpose, provided on its bottom facing the carrier substrate 7 with a cutout 28 accommodating the base 22 and opening 27 formed therein for the contact pin 23. Preferably, the two metal springs 25 exert such a clamping force that, upon insertion of the contact pin 23 into the spring clamping element 24, an oxide layer on the contact pin 23 made of aluminum is at least partially removed. However, it is also conceivable that the contact pin 23 not be bare metal, but can instead, for protection against oxidation and corrosion, be coated with a protective layer of paint or a plastic film that is removed upon insertion in the spring clamping element 24.

The connection socket 3 encompasses the covering element 21. The spring clamping element 24 is electrically connected to the connection cable 4 (or to a connection plug), which is not shown in detail in FIG. 2.

Mounting of the connection socket 3 on the carrier substrate 7 is done on the bottom of the connection socket 3 by means of an all round annular adhesive layer 26, which is, for example, made of an acrylate or polyurethane adhesive. In addition to a simple and durable connection, these adhesives fulfill a sealing function and protect the electrical components contained against moisture and corrosion. In an alternative embodiment, the connection socket 3 is mounted on the carrier substrate 7 exclusively by means of the clamping action between contact pin 23 and spring clamping element 24, dispensing with an adhesive layer 26.

The connection socket 3 can thus be mounted on the carrier substrate 7 and electrically connected to the busbar 18 in a simple manner using automation. For this purpose, the spring contact element 19 is first (after formation of the contact hole 17) inserted into the contact hole 17 and fixed there in electrical contact with the busbar 18 by means of the sealing compound 20. Then, the base 22 of the covering element 21 is positioned on the rear side (IV) of the carrier substrate 7 and fixed by means of ultrasonic welding. In this process, the covering element 21 or the contact pin 23 comes automatically into electrical contact with the spring contact element 19. Subsequently, the connection socket 3 is placed on the rear side (IV) of the carrier substrate 7, with the contact pin 23 being inserted into the spring clamping element 24. The connection socket 3 is affixed on the carrier substrate 7 by means of the adhesive layer 26 previously applied on the connection socket 3 and/or the rear side (IV) of the carrier substrate 7. Alternatively, the mounting is accomplished solely by means of the plug connection between the contact pin 23 and the spring clamping element 24.

The structure depicted in FIG. 2 includes three precautionary measures by means of which the thin-film solar cells 2 are protected against the entry of water and vapor. These are the sealing compound 20 in the contact hole 17, the weld zone 30 between the base 22 and the carrier substrate 7, and the adhesive layer 26 between the connection socket 3 and the carrier substrate 7. By these measures, entry of water molecules can be reliably and certainly avoided.

As already stated, the thin-film solar module 1 includes two connection sockets 3, which are in each case associated with a voltage terminal. Although this is not depicted in FIG. 2, it would be equally possible to provide a single connection socket 3 for the two voltage terminals 5. In this case, care would have to be taken that an electrical arcing between the two spring clamping element 24 be avoided, which can, for example, be accomplished by means of an insulating divider. It would likewise be possible to provide only a single covering element 21, which then correspondingly has two sections, which are in each case associated with a spring contact element 19 and are electrically insulated relative to each other. It would further be possible to provide only a single contact hole 17, in which the two spring contact elements 19 of the two voltage terminals 5, electrically insulated relative to each other, are arranged.

Figure 3:
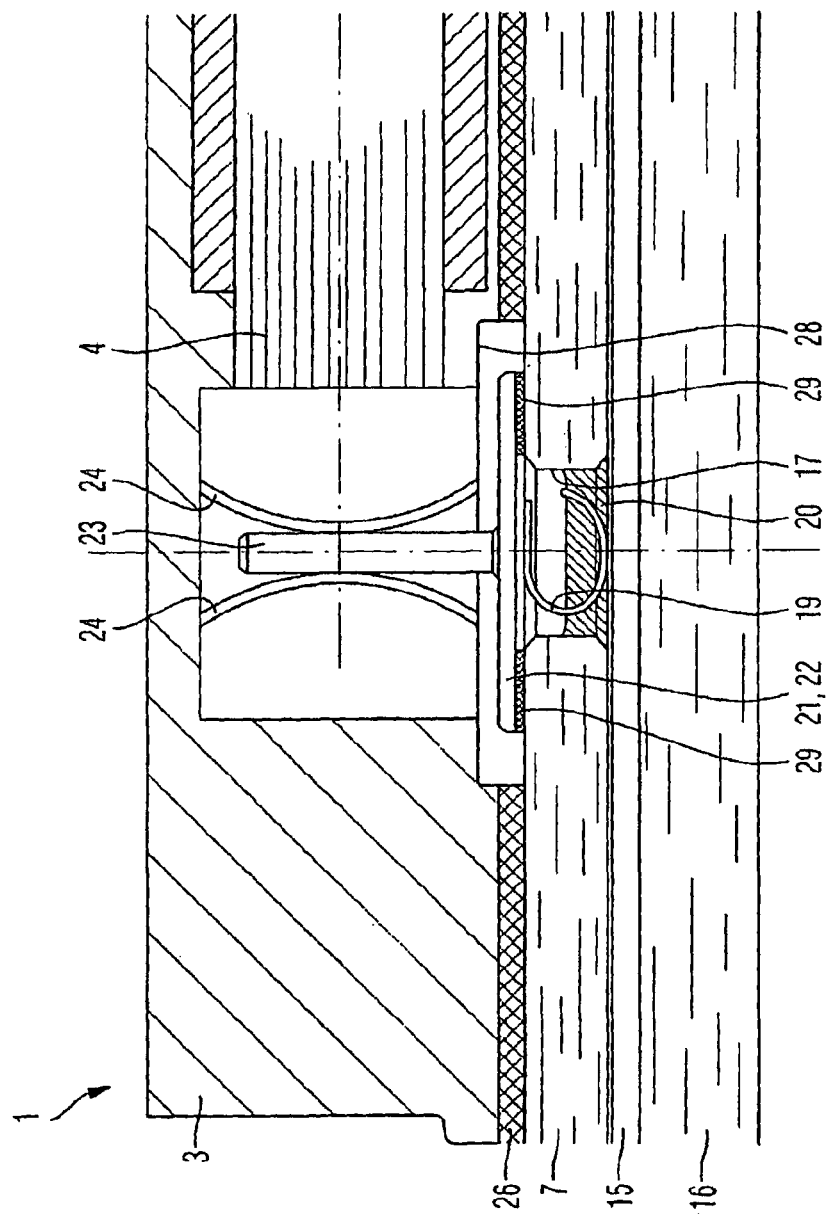
FIG. 3 a schematic representation of a variant of the thin-film solar module of FIG. 1.

FIG. 3 illustrates a variant of the thin-film solar module 1 of FIGS. 1 and 2. To avoid unnecessary repetition, only the differences of this thin-film module 1 are explained and, otherwise, reference is made to the statements there.

Accordingly, the base 22 of the covering element 21 is not mounted on the carrier substrate 7 by ultrasonic welding but rather by an adhesive 29. The adhesive 29 is, for example, implemented as an adhesive layer or double-sided adhesive tape with an acrylic-, polyurethane-, or polyisobutylene-based adhesive.

Figure 4:
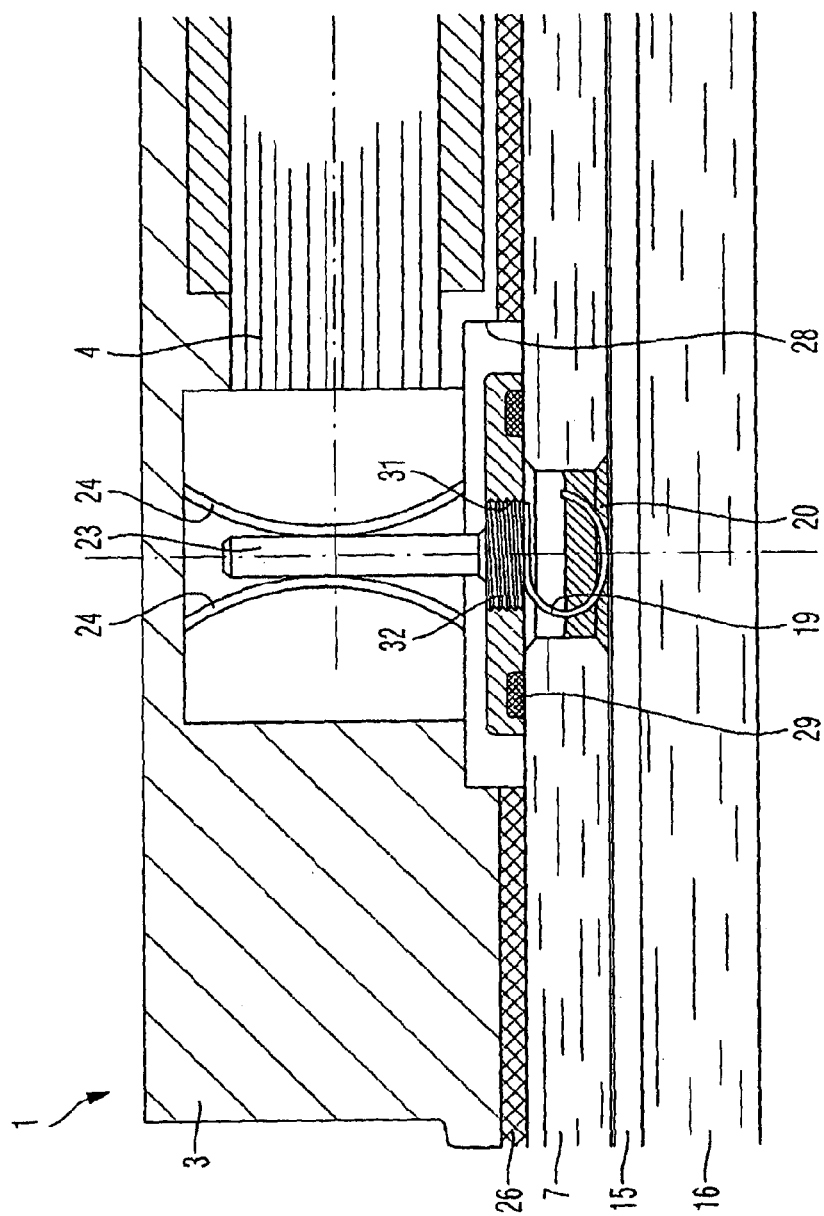
FIG. 4 a schematic representation of another variant of the thin-film solar module of FIG. 1.

FIG. 4 illustrates another variant of the thin-film solar module 1 of FIGS. 1 and 2, wherein, again, only the differences from the first exemplary embodiment are explained.

In this embodiment, the covering element 21 is not implemented as a single piece, but rather consists of the plate-shaped base 22, provided here with a threaded hole 31, into which the contact pin 23 is screwed by means of a threaded base 32. This permits, depending on the application, a selective adaptation of the contact pin 23. In addition, the materials of base 22 and contact pin 23 can be different from each other. In particular, the base 22 can be made of an electrically insulating material. The base 22 is glued to the carrier substrate 7 by an all round annular adhesive 29 (hot-melt adhesive). At the time of the mounting of the base 22 on the carrier substrate 7, the contact pin 23 comes into direct electrical contact with the spring contact element 19.

The invention makes available a solar module, in particular a thin-film solar module, that enables, in industrial series production, simple, economical automated assembly of the connection sockets on contact holes and their connection to the electrode layer(s) of the solar cells. The inward diffusion of water molecules at the contact holes can be reliably and certainly prevented.

LIST OF REFERENCE CHARACTERS 1 thin-film solar module
2 thin-film solar cell
3 connection socket
4 connection cable
5 voltage terminal
6 layer structure
7 carrier substrate
8 absorber layer
9 rear electrode layer
10 semiconductor layer
11 buffer layer
12 front electrode layer
13 incision
14 electrode region
15 intermediate layer
16 cover substrate
17 contact hole
18 busbar
19 spring contact element
20 sealing compound
21 covering element
22 base
23 contact pin
24 spring clamping element
25 metal spring
26 adhesive layer
27 opening
28 cutout
29 adhesive
30 weld zone
31 threaded hole
32 threaded base

The invention claimed is:

1. A solar module, comprising:
a laminated composite comprising a carrier substrate and a cover substrate, between which a layer structure is situated, the layer structure comprising a front electrode layer, a rear electrode layer, and an intermediate semiconductor layer for forming a plurality of solar cells connected in series,
a first spring contact element electrically conductively connected to the rear electrode layer and a second spring contact element electrically conductively connected to the front electrode layer, wherein the first spring contact element and the second spring contact element are completely situated inside at least one cavity formed by at least one contact hole of the carrier substrate,
at least one plate-shaped covering element mounted on the carrier substrate provided with the at least one contact hole, the at least one plate-shaped covering element overlying an outer surface of the carrier substrate away from the layer structure to seal the at least one contact hole and to spring load the first spring contact element and the second spring contact element,
a first contact piece and a second contact piece connected to the at least one plate-shaped covering element, wherein the first contact piece is implemented as contact pin and is electrically conductively connected to the first spring contact element, and wherein the second contact piece is implemented as contact pin and is electrically conductively connected to the second spring contact element, and
at least one connection socket that is mounted, encompassing the at least one plate-shaped covering element, on the carrier substrate provided with the at least one contact hole and has a first mating contact piece and a second mating contact piece, each being implemented as spring clamping element,
wherein the first mating contact piece is electrically conductively connected to the first contact piece in the form of a first plug connection,
wherein the second mating contact piece is electrically conductively connected to the second contact piece in the form of a second plug connection, and
wherein the first contact piece automatically makes electrical contact with the first spring contact element and wherein the second contact piece automatically makes electrical contact with the second spring contact element when mounting the at least one plate-shaped covering element on the carrier substrate provided with the at least one contact hole.

2. The solar module according to claim 1, wherein the first spring contact element is electrically conductively connected via a strip-shaped busbar to the rear electrode layer and the second spring contact element is electrically conductively connected via a strip-shaped bus bar to the front electrode layer.

3. The solar module according to claim 1, wherein the first spring contact element and the second spring contact element are each implemented as an elastically deformable spring contact element having a substantially U-shape, wherein one leg of the U-shape is in contact along a longitudinal portion of the leg with the at least one plate-shaped covering element.

4. The solar module according to claim 1, wherein the at least one connection socket is mounted by the first plug connection and the second plug connection on the carrier substrate provided with the at least one contact hole.

5. The solar module according to claim 4, wherein the first electrical plug connections and the second electrical plug connection each have a latching member.

6. The solar module according to claim 1 further comprising a sealing compound sealing the solar cells against water and vapor of introduced into the at least one contact hole.

7. The solar module according to claim 6, wherein the first spring contact elements and the second spring contact element are fixed in the at least one contact hole by the sealing compound.

8. The solar module according to claim 1, wherein the at least one plate-shaped covering element is mounted by a substance-to-substance bond on the carrier substrate provided with the at least one contact hole.

9. The solar module according to claim 8, wherein the substance-to-substance bond between the at least one plate-shaped covering element and the carrier substrate is implemented all around the contact hole.

10. The solar module according to claim 1, wherein the first contact piece and the second contact piece each are connected to the at least one plate-shaped covering element by a detachable connection.

11. The solar module according to claim 10, wherein the detachable connection is a screw connection.

12. The solar module of claim 1, the solar module being a thin-film solar module.

13. The solar module according to claim 1,
wherein the at least one cavity formed by the at least one contact hole comprises two cavities formed in a respective contact hole of two contact holes,
wherein the at least one plate-shaped covering element comprises two plate-shaped covering elements to seal a respective one of the two contact holes and to spring load a respective one of the first and the second spring contact element, and
wherein the at least one connection socket comprises two connection sockets, each mounted, encompassing a respective one of the two plate-shaped covering elements, and each having a respective one of the first and second mating contact pieces.

14. The solar module according to claim 1, wherein the at least one connection socket comprises a single connection socket.

15. A solar module, comprising:
a laminated composite comprising a carrier substrate and a cover substrate, between which a layer structure is situated, the layer structure comprising a front electrode layer, a rear electrode layer, and an intermediate semiconductor layer for forming a plurality of solar cells connected in series,
a first spring contact element electrically conductively connected to the rear electrode layer and a second spring contact element electrically conductively connected to the front electrode layer, wherein the first spring contact element and the second spring contact element are completely situated inside-at least one cavity formed by at least one contact hole of the carrier substrate,
at least one plate-shaped covering element mounted on the carrier substrate provided with the at least one contact hole, the at least one plate-shaped covering element overlying an outer surface of the carrier substrate away from the layer structure to seal the at least one contact hole and to spring load the first spring contact element and the second spring contact element,
a first contact piece and a second contact piece connected to the at least one plate-shaped covering element, wherein the first contact piece is implemented as contact pin and is electrically conductively connected to the first spring contact element, and wherein the second contact piece is implemented as contact pin and is electrically conductively connected to the second spring contact element, and
at least one connection socket that is mounted, encompassing the at least one plate-shaped covering element, on the carrier substrate provided with the at least one contact hole and has a first mating contact piece and a second mating contact piece, each being implemented as spring clamping element,
wherein the first mating contact piece is electrically conductively connected to the first contact piece in the form of a first plug connection,
wherein the second mating contact piece is electrically conductively connected to the second contact piece in the form of a second plug connection, and
wherein the first contact piece and the second contact piece each are connected to the at least one plate-shaped covering element by a detachable connection that is a screw connection.

16. A method for automated production of a solar module, comprising:
preparing a laminated composite comprising a carrier substrate and a cover substrate, between which a layer structure is situated, the layer structure comprising a front electrode layer, a rear electrode layer, and an intermediate semiconductor layer for forming a plurality of solar cells connected in series;
forming at least one contact hole in the carrier substrate;
arranging a first spring contact element in the at least one contact hole and in electrically conductive connection to the rear electrode layer;
arranging a second spring contact element in the at least one contact hole and in electrically conductive connection to the front electrode layer,
overlying a plate-shaped covering element on a surface of the carrier substrate away from the layer structure, thereby spring loading the first spring contact element and the second spring contact element and covering the at least one contact hole, wherein the plate-shaped covering element has a first contact piece that is electrically connected to the first spring contact element, and has a second contact piece that is electrically connected to the second spring contact element; and
mounting at least one connection socket encompassing the plate-shaped covering element on the carrier substrate provided with the at least one contact hole, wherein the at least one connection socket has a first mating contact piece and a second mating contact piece, wherein the first mating contact piece is brought into an electrically conductive plug connection with the first contact piece and the second mating contact piece is brought into an electrically conductive plug connection with the second contact piece, wherein the first contact piece automatically makes electrical contact with the first spring contact element and wherein the second contact piece automatically makes electrical contact with the second spring contact element when mounting the at least one plate-shaped covering element on the carrier substrate provided with the at least one contact hole.

17. The method according to claim 16, wherein the first spring contact element and the second spring contact element are each fixed by a sealing compound introduced into the contact hole sealing the solar cells against water and vapor of the external surroundings.

18. The method according to claim 16 wherein the at least one connection socket is mounted by plugging in the first mating contact piece on the first contact piece and plugging in the second mating contact piece on the second contact piece on the carrier substrate provided with the at least one contact hole.

19. The method of claim 16, the solar module being a thin-film solar module.

* * * * *